(12) United States Patent
Chen

(10) Patent No.: US 12,557,663 B2
(45) Date of Patent: Feb. 17, 2026

(54) LEAD FRAME, CHIP PACKAGE STRUCTURE, AND MANUFACTURING METHOD THEREOF

(71) Applicant: Silergy Semiconductor Technology (Hangzhou) LTD, Hangzhou (CN)

(72) Inventor: Shijie Chen, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 17/879,945

(22) Filed: Aug. 3, 2022

(65) Prior Publication Data

US 2022/0375765 A1 Nov. 24, 2022

Related U.S. Application Data

(63) Continuation of application No. 16/840,672, filed on Apr. 6, 2020, now Pat. No. 11,410,854.

(30) Foreign Application Priority Data

Apr. 15, 2019 (CN) .......................... 201910300320.1

(51) Int. Cl.
| | |
|---|---|
| *H01L 21/48* | (2006.01) |
| *H01L 21/56* | (2006.01) |
| *H01L 23/495* | (2006.01) |
| *H01L 23/498* | (2006.01) |

(52) U.S. Cl.
CPC ........ *H01L 21/4828* (2013.01); *H01L 21/568* (2013.01); *H01L 23/49548* (2013.01); *H01L 23/49582* (2013.01); *H01L 23/49861* (2013.01)

(58) Field of Classification Search
CPC ..... H01L 21/4821–4842; H01L 21/568; H01L 23/495–49596; H01L 23/49861
See application file for complete search history.

(56) References Cited

U.S. PATENT DOCUMENTS

| | | | |
|---|---|---|---|
| 7,193,302 B2 | 3/2007 | Tseng | |
| 8,106,492 B2* | 1/2012 | Chang Chien | ........ H01L 21/565 257/784 |
| 8,617,933 B2 | 12/2013 | Camacho et al. | |
| 8,674,487 B2 | 3/2014 | Yu et al. | |
| 8,836,093 B2 | 9/2014 | Tan | |

(Continued)

FOREIGN PATENT DOCUMENTS

CN 103745939 A * 4/2014

OTHER PUBLICATIONS

Dan et al., CN 103745939 A, machine translation. (Year: 2014).*

*Primary Examiner* — Timor Karimy

(57) ABSTRACT

A method of forming a lead frame can include: providing a frame base; providing a substrate to support the frame base; and selectively etching the frame base to form first and second type pins. The first type pins are distributed in the central area of the lead frame, and the second type of the pins are distributed in the edge area of the lead frame. The first type pins are separated from the second type of the pins, and the first and second type pins are not connected by connecting bars. A pattern of a first surface of the first and second type pins is different from that of a second surface of the first and second type pins. The metal of the first surface is different from the metal of the second surface, and the second surface is opposite to the first surface.

10 Claims, 13 Drawing Sheets

(56) References Cited

U.S. PATENT DOCUMENTS

| | | |
|---|---|---|
| 8,866,273 B2 | 10/2014 | Tan |
| 9,024,440 B2 | 5/2015 | Tan |
| 9,123,629 B2 | 9/2015 | Tan |
| 9,373,567 B2 | 6/2016 | Tan |
| 2003/0034563 A1 | 2/2003 | Reyes et al. |
| 2010/0084749 A1* | 4/2010 | Hong ................ H01L 23/49572 257/673 |
| 2015/0214200 A1 | 7/2015 | Tan et al. |
| 2016/0365257 A1 | 12/2016 | Tan |
| 2017/0110441 A1 | 4/2017 | Tan |
| 2017/0294369 A1 | 10/2017 | Kawashima et al. |

* cited by examiner

LEAD FRAME, CHIP PACKAGE STRUCTURE, AND MANUFACTURING METHOD THEREOF

RELATED APPLICATIONS

This application is a continuation of the following application, U.S. patent application Ser. No. 16/840,672, filed on Apr. 6, 2020, and which is hereby incorporated by reference as if it is set forth in full in this specification, and which also claims the benefit of Chinese Patent Application No. 201910300320.1, filed on Apr. 15, 2019, which is incorporated herein by reference in its entirety.

FIELD OF THE INVENTION

The present invention generally relates to the field of semiconductor technology, and more particularly to lead frames, chip package structures, and associated manufacturing methods.

BACKGROUND

A lead frame, as a die carrier of integrated circuits, plays a role of connecting a die and an external circuit. Thus, the lead frame is a basic component for manufacturing integrated circuits. In current Quad Flat No-lead (QFN) packages, a common method of manufacturing a frame substrate can include double-surfaces etching and partially electroplating, which is applicable for most products. However, one disadvantage is that all pins and exposed pads are typically required to be connected with the edge of the package by connecting bars. As a result, if the die size is large and the number of pins is large, the layout of power switches of the die may not be effectively completed.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
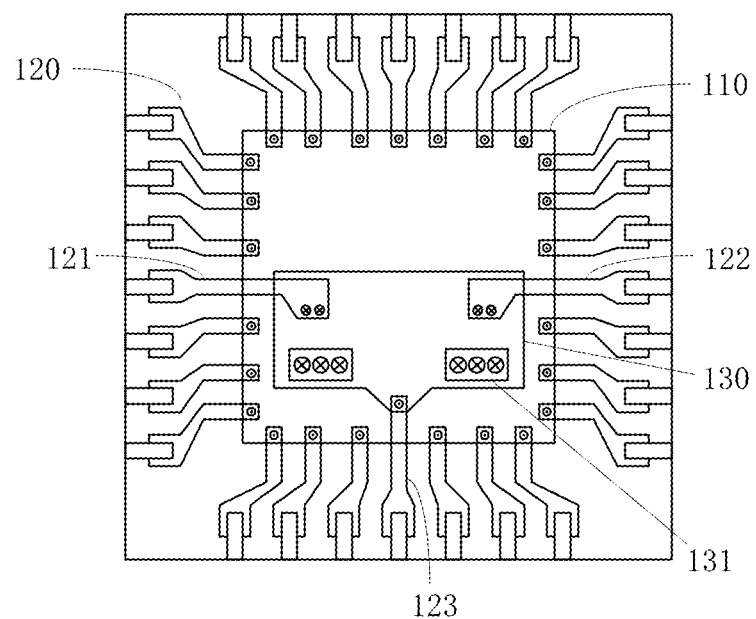
FIG. 1 is a top view diagram of an example lead frame.

Referring now to FIG. 1, shown is a top view diagram of an example lead frame. In this particular example, a Quad Flat No-lead (QFN) package can include a lead frame and die 110. Here, the lead frame can include first pin 120 distributed in the edge area of the lead frame, and second pin 130 distributed in the central area of the lead frame. Also, second pin 130 can include exposed pad 131. In this case, second pins 130 are connected to the edge of the lead frame by connecting bars; that is, second pin 130 is connected to first pins 121, 122, and 123 by connecting bars. Thus, the potential of first pins 121, 122, and 123 are equal to that of exposed pad 131, which may result in a waste of the three pins. In addition, the position of second pin 130 can be set according to the position of the connecting bars. In the case, the pins of lead frame may not be fully and efficiently laid out and utilized.

In particular embodiments, a lead frame can include first and second type pins. Moreover, the first type pins of the lead frame and the second type of the pins of the lead frame can be distributed in the central area of the lead frame and in the edge area of the lead frame, respectively. Also, the first type pins of the lead frame may not need to be connected to the second type of the pins of the lead frame by connecting bars. Furthermore, a pattern of a first surface of the two types of the pins can be different from that of a second surface of the two types of the pins. In addition, the metal in the first surface may be different from the metal in the second surface. For example, the second surface is opposite to the first surface.

Figure 2:
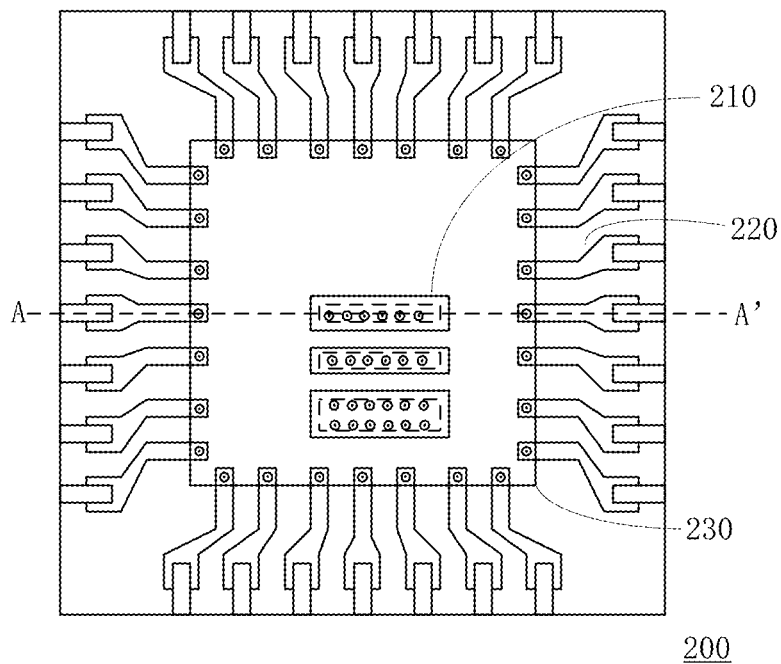
FIG. 2 is a top view diagram of an example of a lead frame, in accordance with embodiments of the present invention.

Referring now to FIG. 2, shown is a top view diagram of an example of a lead frame, in accordance with embodiments of the present invention. In this particular example, lead frame 200 can include at least one first type pins 210 distributed in the central area of the lead frame, and second type pins 220 distributed in the edge area of the lead frame. Also, the first type pins of the lead frame may be separated from the second type of the pins of the lead frame. In addition, the first type pins of the lead frame do not need to be connected to the second type of the pins of the lead frame by connecting bars. Because first type pins 210 may not be connected to the edge area of the lead frame by connecting bars, second type pins 220 distributed in the edge area of the lead frame can be pins having other functions. In addition, first type pins 210 can be flexibly set. For example, first type pins 210 can be set according to the layout of power switches in a die, such as for a switching converter.

In particular embodiments, the first type pins can be exposed pads, or may be pins with different functions (e.g., power input pin Vin, switching pin LX, voltage output pin VOUT, etc.). For example, first type pins 210 and second type of the pins 220 can include an outside pin layer connected to external circuits, and an inner pin layer connected to die pads. In addition, an area of the outside pin layer may be less than an area of the inner pin layer. Also, a pattern of a first surface of the two types of the pins may be different from that of a second surface of the two types of the pins. In addition, metal used in the first surface may be different from metal used in the second surface, where the second surface is opposite to the first surface. For example, the outside pin layer can be configured as a welding layer as a connecting medium that is directly connected with the external circuits. For example, the welding layer can be electroplated metal (e.g., a NiPdAu layer), and the lead frame can be a QFN lead frame.

Particular embodiments can also include a chip package structure that includes a lead frame, die 230 mounted on the inner pin layer, and an encapsulated body encapsulating the lead frame and the dies. For example, the second surface of the first type pins and the second type pins may be exposed to directly connect to outside circuits. For example, die 230 can be flipped to be mounted on the lead frame. In other examples, wire bonding or other suitable mounting methods can be employed.

Particular embodiments can also include a method of manufacturing the lead frame. The method can include providing a frame base, providing a substrate to support the frame base, and selectively etching the frame base to form first and second types of pins of the lead frame. For example, the first type pins of the lead frame can be distributed in the central area of the lead frame, and the second type of the pins of the lead frame can be distributed in the edge area of the lead frame. The first type pins may be separated from the second type of the pins, and the first type pins of the lead frame may not be connected to the second type of the pins of the lead frame by connecting bars. Furthermore, the pattern of the first surface of the two types of the pins may be different from that of the second surface of the two types of the pins. Also, and the metal used in the first surface may be different from the metal used in the second surface.

Figure 3:
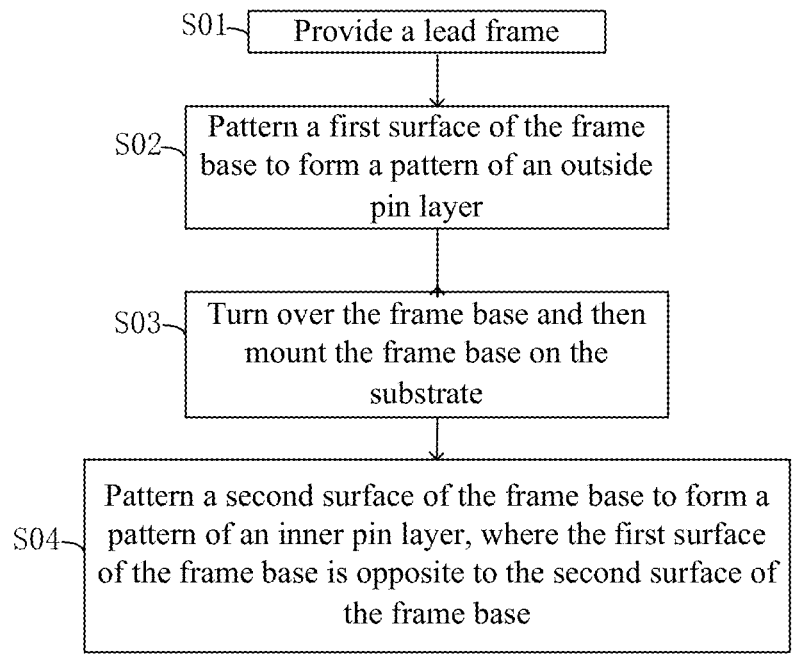
FIG. 3 is manufacturing flow chart of an example lead frame, in accordance with embodiments of the present invention.

Referring now to FIG. 3, shown is manufacturing flow diagram of an example method of making a lead frame, in accordance with embodiments of the present invention. In S01, a frame base can be provided. In S02, a first surface of the frame base may be patterned to form a pattern of an outside pin layer. In S03, the frame base can be turned over and then placed on the substrate. In S04, a second surface of the frame base can be patterned to form a pattern of an inner pin layer. Here, the second surface of the frame base may be opposite to the first surface of the frame base. For example, the lead frame can be formed by a substrate as a carrier, and the first type pins in the central area of the lead frame may not be required to be connected to the second type of the pins in the edge area of the lead frame by connecting bars. Therefore, the second type of the pins can be more flexibly set with wider applicability.

Figure 4A:
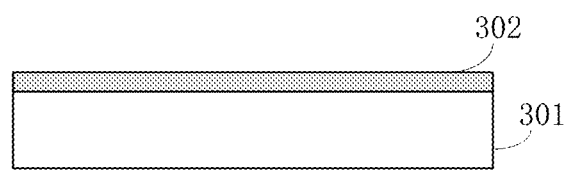
FIGS. 4A-4G are cross-section diagrams of a first example of the lead frame and the chip package in some steps of manufacturing the lead frame and the chip package, in accordance with embodiments of the present invention.

Referring now to FIGS. 4A-4G, shown are cross-section diagrams of a first example of the lead frame and the chip package in some steps of manufacturing the lead frame and the chip package, in accordance with embodiments of the present invention. In FIG. 4A, frame base 301 may be provided, and the first surface of the frame base can be pretreated to form welding layer 302. For example, the pretreatment process can be to electroplate metal on the first surface of the frame base, and the electroplated metal can be NiPdAu, or other metals with good weldability and oxidation resistance. As a welding layer, NiPdAu layer has relatively high welding reliability and good heat dissipation. For example, frame base 301 can include Cu or copper alloys. However, those skilled in the art can also select other materials with good electrical conductivity, heat conductivity, and high reliability as the frame base.

Figure 4B:
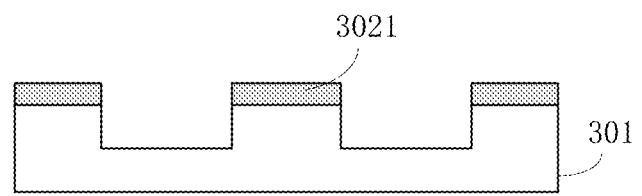

In FIG. 4B, an etching process on the first surface of the frame base can be performed after pretreatment. For example, the first etching starts from the first surface of the frame base, extends along the thickness direction of the frame base, and stops in the frame base 301. A depth of the first etching may be less than the thickness of the frame base, where the thickness direction of the frame base is from the first surface of the frame base to the second surface of the frame base, and the first surface of the frame base is opposite to the second surface of the frame base. Furthermore, a concave-convex shape on a first surface of the frame base can be formed after the first etching, and the first surface of the frame base that is not etched (e.g., the surface of the convex portion) can be the pattern of the outside pin layer 3201.

In addition, the thickness of the frame base etched by the first etching process may be set according to a spacing between the adjacent outside pins. For example, the first etching can be performed by adopting an isotropic etching. Thus, the spacing between the adjacent outside pins may be related to the thickness of the etched part of the frame base. For example, the thickness of the frame base etched by the first etching process can be relatively close to or the same as the spacing between adjacent outside pins of the lead frame. In particular embodiments, because the etching rate of isotropic etching in all directions of the material is the same, the spacing between adjacent outside pins and the thickness of etching frame base can be realized in one step, which can reduce process complexity.

Figure 4C:
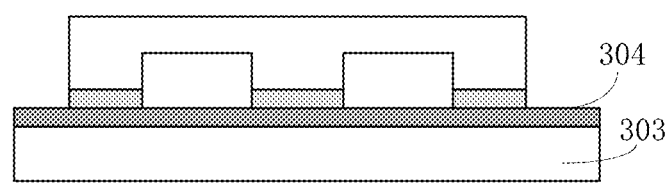

In FIG. 4C, substrate 303 may be provided. For example, the substrate is a copper coated with asphalt and has characters of acid resistance and heat resistance in order to avoid being etched by subsequent processes. Of course, those skilled in the art can also select compound materials with characters of acid resistance and heat resistance as the substrate. On the first surface of substrate 303, UV film 304 may be formed. Then, the frame base may be turned over and pasted to UV film 304. Here, the more a thermal expansion coefficient of the material of the substrate approaches the glass transition temperature of the encapsulated material Tg, the better the stability of the package structure. Because the temperature in the subsequent processes is relatively high, the thermal expansion coefficient of the material of the substrate selected can approach the glass transition temperature of the encapsulated material Tg, in order to avoid deformation of the substrate during the process of encapsulation. Thus, contraction of the pins of the lead frame that may otherwise result from deformation of the substrate can be substantially avoided.

Figure 4D:
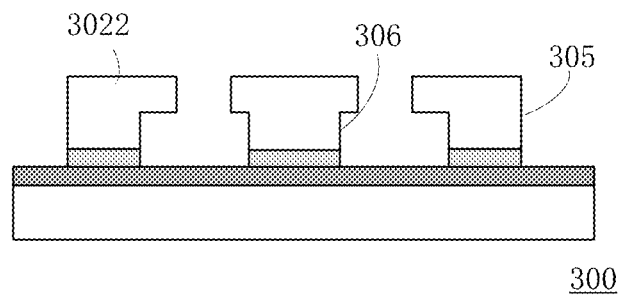

In FIG. 4D, the second surface of the frame base may be etched. For example, a second etching can be selectively performed in an area where the frame base is thinned by the first etching, and from the second surface of the frame base, in order to form the separated first type pins and second type pins. After this step, separated first type pin 306 and second type pin 305 can be formed. Further, the surface of the concave area formed by the second etching can be a pattern of inner pin layer 3022. A completed lead frame 300 can be as shown in FIG. 4D. Here, the pins of the lead frame can include second type pin 305 in the edge area of lead frame, and first type pin 306 in the central area of the lead frame. Moreover, e.g., the distribution of second type pin 305 is L-shaped, and the distribution of first type pin 306 is T-shaped.

Figure 4E:
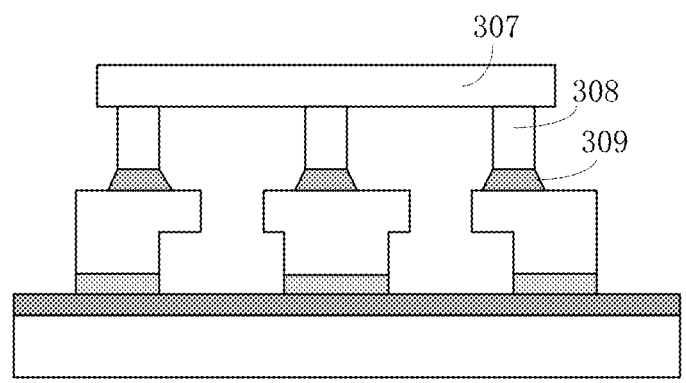
Figure 4F:
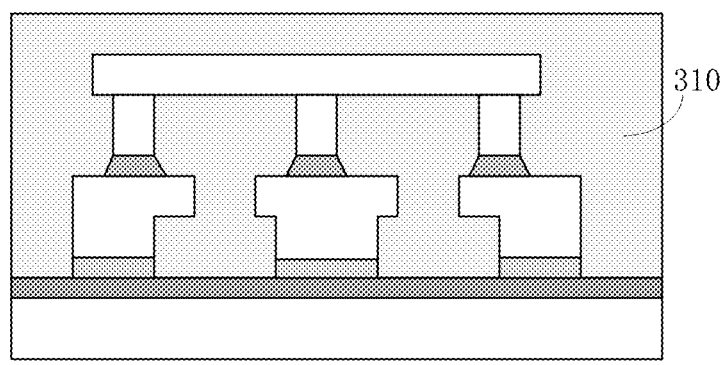

In FIG. 4E, die 307 can be mounted on the inner pin layer. For example, die 307 can be mounted on the inner pin layer by conductive pillar 308 and welding material 309. For example, die 307 can be flipped to be mounted on the lead frame. In other examples, die 307 can be mounted on the lead frame without being flipped. In FIG. 4F, the lead frame, dies, and conductive pillars can be encapsulated with encapsulated material 310. Here, the substrate may be exposed outside encapsulated material 310.

Figure 4G:
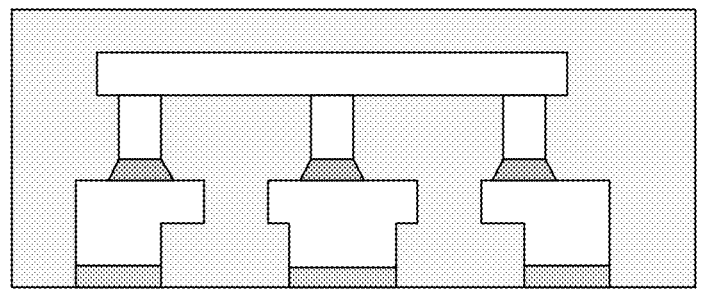

In FIG. 4G, after removing the substrate, chip package structure 300 can be formed. In chip package structure 300, the outside pin layer of the lead frame may be exposed in order to realize the connection with external circuits. For example, the substrate and the UV film can be irradiated with blue light, such that the substrate can be separated from the UV film. The substrate can also be recycled after removal from the lead frame.

Figure 5A:
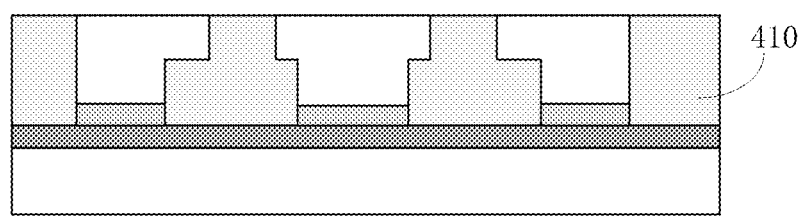
FIGS. 5A-5C are cross-section diagrams of a second example of the lead frame and the chip package in some steps of manufacturing the lead frame and the chip package, in accordance with embodiments of the present invention.
Figure 5B:
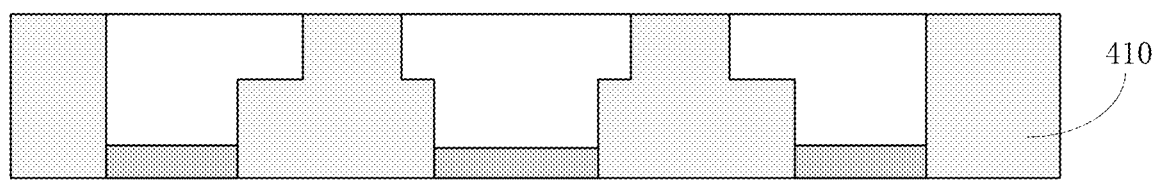
Figure 5C:
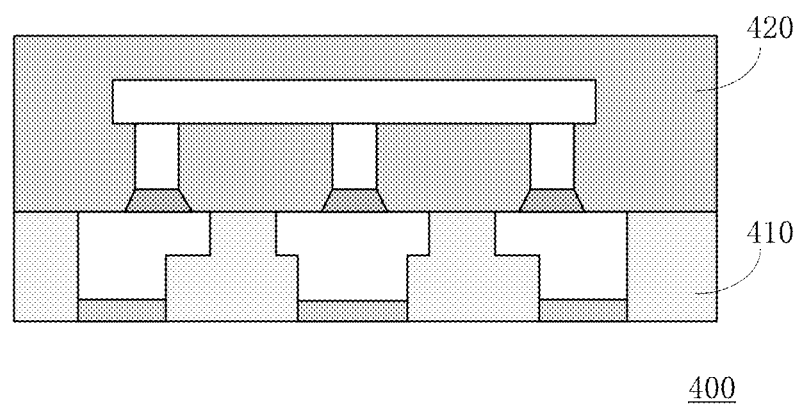

Referring now to FIGS. 5A-5C, shown are cross-section diagrams of a second example of the lead frame and the chip package in some steps of manufacturing the lead frame and the chip package, in accordance with embodiments of the present invention. The steps of the manufacturing method in this particular example may be the same as those shown above in FIGS. 4A-4D. After these steps are finished, the steps shown in FIGS. 5A-5C can be performed in order.

In FIG. 5A, the lead frame formed as above can be encapsulated with encapsulated material 410. Here, the substrate and the inner pin layer may be exposed outside encapsulated material 410. As FIG. 5B shows, the substrate and the UV film can be irradiated with blue light, in order to remove the substrate and the UV film. Therefore, the outside pin layer can be exposed in order to realize the connection with external circuits.

In FIG. 5C, the die can be mounted on the inner pin layer exposed, and the die may be encapsulated with encapsulated material 420 such that chip package structure 400 may be formed. For example, die 307 can be mounted on the lead frame by wire bonding, or flipped to be mounted on the lead frame. In addition, the methods of particular embodiments may be suitable for a lead frame which is similar to a QFN lead frame and does not have pins. Also, particular embodiments can be applied to manufacturing lead frames without pins.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A lead frame, comprising:
    a) a frame base;
    b) pins of the lead frame, comprising first type pins and second type pins;
    c) wherein the first type pins are distributed in a central area of the lead frame, the second type pins are distributed in an edge area of the lead frame, the first type pins are separated from the second type pins, the first and second type pins are not connected by conductive material or connecting bars, a pattern of a first surface of the first and second type pins is different from that of a second surface of the first and second type pins, a metal of the first surface is different from a metal of the second surface, and the second surface is opposite to the first surface;
    d) wherein the lead frame is encapsulated with an encapsulator to expose the second surface of the pins, and a lower surface of the encapsulator is substantially flush with lower surfaces of the first type pins and the second type pins;
    e) wherein the second surface of the pins is farther from the frame base than the first surface of the pins; and
    f) a die mounted on the second surface of the first type pins and the second type pins, wherein the die fully overlaps with the first type pins and parts of each of the second type pins.

2. The lead frame of claim 1, wherein the first surface of the first and second type pins is configured to be a welding layer such that the first surface is connectable to an external circuit by the welding layer.

3. The lead frame of claim 1, wherein an area of the first surface of the first and second type pins is less than an area of the second surface of the two types of the pins.

4. The lead frame of claim 1, wherein the lead frame is configured as a QFN lead frame.

5. The lead frame of claim 1, wherein a first surface of a frame base is electroplated with a NiPdAu layer.

6. The lead frame of claim 1, wherein the encapsulator exposes the second surface of the first and second type pins.

7. The lead frame of claim 1, wherein each of the first type pins comprises an exposed pad.

8. The lead frame of claim 1, wherein each of the first type pins forms a T shape, and each of the second type pins forms an L shape.

9. The lead frame of claim 1, wherein the encapsulator encapsulates the die and the lead frame.

10. The lead frame of claim 9, wherein all of the second type pins are connected to the die.

* * * * *